(12) United States Patent
Letertre et al.

(10) Patent No.: US 7,122,095 B2
(45) Date of Patent: Oct. 17, 2006

(54) METHODS FOR FORMING AN ASSEMBLY FOR TRANSFER OF A USEFUL LAYER

(75) Inventors: Fabrice Letertre, Grenoble (FR); Olivier Rayssac, Grenoble (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 10 days.

(21) Appl. No.: 10/800,252

(22) Filed: Mar. 11, 2004

(65) Prior Publication Data

US 2004/0206444 A1    Oct. 21, 2004

Related U.S. Application Data

(60) Provisional application No. 60/490,796, filed on Jul. 28, 2003.

(30) Foreign Application Priority Data

Mar. 14, 2003    (FR) .................. 03 03163

(51) Int. Cl.
*B32B 37/26* (2006.01)
*B32B 38/10* (2006.01)

(52) U.S. Cl. ............ 156/344; 156/257; 156/267; 427/275; 438/458

(58) Field of Classification Search .......... 156/344, 156/584, 257, 267, 288; 438/458; 427/275
See application file for complete search history.

(56) References Cited

U.S. PATENT DOCUMENTS

| | | | |
|---|---|---|---|
| 5,156,896 A * | 10/1992 | Katoh et al. ............. 428/81 |
| 5,391,257 A | 2/1995 | Sullivan et al. .......... 156/630 |
| 5,514,425 A * | 5/1996 | Ito et al. ................ 427/534 |
| 5,863,830 A | 1/1999 | Bruel et al. ............. 438/478 |
| 6,100,166 A | 8/2000 | Sakaguchi et al. ....... 438/455 |
| 6,177,359 B1 | 1/2001 | Chen et al. ............. 438/751 |
| 6,287,891 B1 | 9/2001 | Sayyah ................... 438/106 |
| 6,316,333 B1 | 11/2001 | Bruel et al. ............. 438/458 |
| 6,335,258 B1 | 1/2002 | Aspar et al. ............ 438/406 |

(Continued)

FOREIGN PATENT DOCUMENTS

EP    0 106 566 B1    11/1989

(Continued)

OTHER PUBLICATIONS

S. Kodama et al., XP-00935156 "Variable Threshold AlGaAs/ InGaAs Heterostructure Field-Effect Transistors with Paired Gated Gabricated Using the Wafer-Bonding Technique", vol. 241ga, p. 434-435 (19099).

*Primary Examiner*—Mark A. Osele
(74) *Attorney, Agent, or Firm*—Winston & Strawn LLP

(57) ABSTRACT

Methods for forming an assembly for transfer of a useful layer are described. In an embodiment, the method includes forming a useful layer on a first support having an interface therebetween, and a residual material on a portion of the first support to form the assembly, and processing the assembly to attenuate any bond between the useful layer and the first support caused by the residual material. An implementation of the method includes processing the assembly to remove residual material. In another variation, processing of the assembly includes forming at least one cut or separating channel between a free surface of the useful layer and the interface to separate the useful layer from contact with the residual material. In yet another variation, processing of the assembly includes forming a peripheral recess so that the residual material does not contact the useful layer.

28 Claims, 2 Drawing Sheets

U.S. PATENT DOCUMENTS

| | | | |
|---|---|---|---|
| 6,376,332 B1 | 4/2002 | Yanagita et al. | 438/458 |
| 6,406,636 B1 | 6/2002 | Vaganov | 216/2 |
| 6,448,155 B1 | 9/2002 | Iwasaki et al. | 438/464 |
| 6,465,327 B1 | 10/2002 | Aspar et al. | 438/458 |
| 6,534,380 B1 | 3/2003 | Yamauchi et al. | 438/455 |
| 6,548,338 B1 | 4/2003 | Bernstein et al. | 438/210 |
| 6,562,648 B1 | 5/2003 | Wong et al. | 438/46 |
| 6,586,044 B1 * | 7/2003 | Takeshita et al. | 427/129 |
| 6,624,047 B1 * | 9/2003 | Sakaguchi et al. | 438/458 |
| 6,673,694 B1 | 1/2004 | Borenstein | 438/411 |
| 6,700,631 B1 | 3/2004 | Inoue et al. | 349/45 |
| 6,727,549 B1 | 4/2004 | Doyke | 257/347 |
| 6,767,763 B1 | 7/2004 | Uchiyama | 438/116 |
| 6,809,009 B1 | 10/2004 | Aspar et al. | 438/459 |
| 2001/0055854 A1 | 12/2001 | Nishida et al. | 438/455 |
| 2002/0042189 A1 | 4/2002 | Tanaka | 438/450 |
| 2002/0081822 A1 | 6/2002 | Yanagita et al. | 438/458 |
| 2002/0096717 A1 | 7/2002 | Chu et al. | 257/347 |
| 2002/0132451 A1 | 9/2002 | Akino et al. | 438/478 |
| 2003/0234075 A1 | 12/2003 | Aspar et al. | 156/344 |

FOREIGN PATENT DOCUMENTS

| | | |
|---|---|---|
| EP | 0 977 252 A1 | 2/2000 |
| EP | 1059663 * | 12/2000 |
| FR | 2811807 | 1/2002 |
| JP | 3106052 | 5/1991 |
| JP | 6229849 | 8/1994 |
| JP | 10320851 | 12/1998 |
| WO | WO 01/04933 A1 | 1/2001 |
| WO | WO 02/05344 A1 | 1/2002 |
| WO | WO 03/081664 A2 | 10/2003 |

* cited by examiner

METHODS FOR FORMING AN ASSEMBLY FOR TRANSFER OF A USEFUL LAYER

This application claims the benefit of provisional application 60/490,796 filed Jul. 28, 2003, the content of which is expressly incorporated herein by reference thereto.

BACKGROUND ART

The present invention generally relates to methods of fabricating substrates for microelectronics, optoelectronics, or optics involving transfer of a useful layer from a first support to a second support.

Various techniques have recently been developed to allow the mechanical transfer of a layer of semiconductor material from a first support to a second support. The layer may or may not have undergone component production treatments before the transfer. For example, one treatment uses buried porous layers that can be attacked chemically and has been described in U.S. Pat. No. 6,100,166. Another method utilizes substrates weakened by implanting gas species to obtain a thin useful layer that can be detached from the remainder of the material by fracture at the implanted zone. Lastly, molecular bonding techniques utilize a controlled bonding energy so that a mechanical force can result in detachment of a layer which has been temporarily bonded to a support.

When a useful layer is connected to a first support using one of the above techniques, transfer of the layer involves bringing a second support into contact with the free face of the useful layer using suitable bonding forces. The free face of the assembly including the useful layer and the first support is known as the "front" face. The transfer is completed by applying stress forces (typically tension and/or bending and/or shear forces) between the useful layer and the first support. One or more tools could be used to detach the useful layer, such as a drawing rig or a blade introduced laterally at the weakened interface to propagate a crack, or a jet of fluid can be applied to the weakened interface (see, for example, International Application Publication No. WO01/04933). When the useful layer has not undergone any component fabrication steps, then the transfer is generally carried out regardless of the bonding technique employed to affix the useful layer to the second support (such as by molecular bonding, eutectic bonding, bonding using a polymer or resin, etc).

However, if the useful layer has already undergone steps in the component fabrication process, then it is often necessary to carry out different types of deposition treatments (for example, semiconducting or semiconductive oxides or nitrides, polycrystalline semiconductor, amorphous semiconductor, monocrystalline semiconductor formed by homo-or hetero-epitaxy). For example, when a "full wafer" method is carried out in a specific reactor, the deposits have a tendency to partially or completely cover the free face of the useful layer and to overflow onto the side faces of the substrate that include the useful layer and the first support. Such an overflow produces a useful layer that is encapsulated resulting in a strengthening of the bond at the periphery between the useful layer and the first support. This condition can cause problems during the subsequent detachment step required to transfer the useful layer to the second support.

SUMMARY OF THE INVENTION

The present invention provides methods for forming an assembly for transfer of a useful layer that overcomes the drawbacks mentioned above. In particular, the method includes forming a useful layer on a first support having an interface therebetween, and residual material on a portion of the first support to form the assembly, and processing the assembly to attenuate bonding between the useful layer and the first support caused by the residual material.

In an advantageous implementation, the useful layer is weakly bonded to the support to facilitate detachment. In a variation, the interface may be a detachable interface layer provided on the first support before forming the useful layer.

In another advantageous variation, processing of the assembly includes removal of residual material. Generally, at least a portion of the first support in contact with the residual material may be removed. Also, at least a portion of a peripheral zone of material covering an edge of the interface may be removed, with the removal made by at least one of splitting or etching. If desired, the useful layer may be masked before etching.

In another advantageous embodiment, processing of the assembly includes forming at least one cut or separating channel between a free surface of the useful layer and the interface to separate the useful layer from contact with the residual material. A plurality of separating channels may be cut to form a plurality of islets. The separating channel may be cut by using at least one of a saw splitting technique, a laser splitting technique, and an ion beam splitting and masked chemical etching technique.

In yet another variation, processing of the assembly includes forming a peripheral recess in the first support so that the residual material does not contact the useful layer. The width and depth of the peripheral recess is sufficient to accommodate the volume of residual material resulting from formation of the useful layer.

A further aspect of the invention pertains to a support for fabricating substrates or components on substrates which can be treated to receive at least a portion of a useful layer. The treatment results in the formation of a peripheral zone of material. The improvement comprises providing a peripheral recess zone in the support for receiving the residual material to prevent bonding between the residual material and the useful layer.

Another advantageous implementation includes a support for fabricating substrates or components which can be treated to receive at least a portion of a useful layer. The treatment results in the formation of a peripheral zone of residual material, and thus a peripheral recessed zone is provided in the support for receiving the residual material to prevent bonding between the residual material and the useful layer.

Another advantageous embodiment of the invention concerns a substrate that includes a support and a useful layer having an interface therebetween. The useful layer is intended to be transferred to a second support by affixing a free surface of the useful layer to the second support and detaching it at the interface. The useful layer forms a peripheral zone of material that can at least partially cover the interface, and the substrate includes at least one separating cut or channel located between a free surface of the useful layer and the interface to separate the useful layer from contact with the peripheral zone of material.

As described above, the present invention provides methods for transferring a useful layer of a monocrystalline material from a first support to a second support, a support and a substrate, for use in fabricating substrates or components on substrates for microelectronics, optoelectronics, or optics. The method includes forming a first substrate comprising the first support and at least a portion of the useful layer with an interface between the first support and the useful layer. A treatment involving the useful layer results in the formation of a peripheral zone of material that may at least partially laterally cover the interface. In an advantageous implementation, the material is removed, thus enabling a detachment means to be used on the interface. A free face of the useful layer is then affixed to a second support, and the useful layer is detached at the interface between the first support and the useful layer. Other advantageous methods are also described herein for effectively transferring a useful layer from a first support to a second support.

BRIEF DESCRIPTION OF THE DRAWINGS

Other aspects, purposes and advantages of the invention will become clear after reading the following description with reference to the attached drawings, in which.

DETAILED DESCRIPTION OF THE PREFERRED EMBODIMENTS

Figure 1:
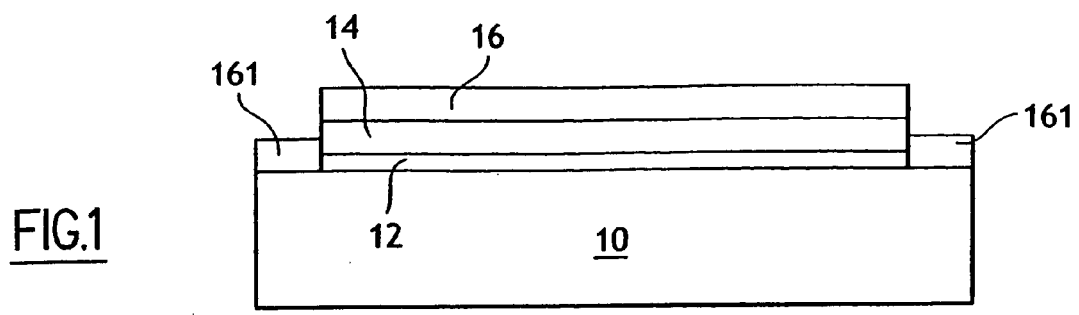
FIG. 1 is a cross sectional view of a first substrate comprising a first support and a useful layer.
Figure 2:
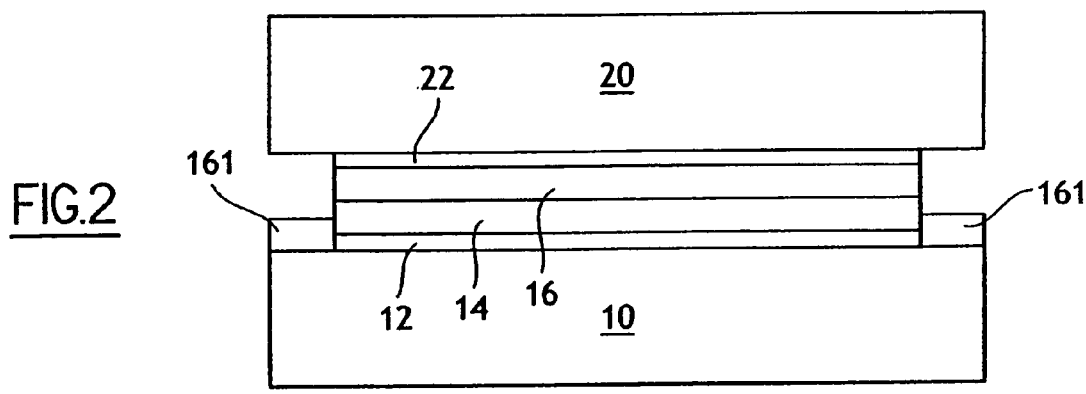
FIG. 2 is a cross sectional view of a second support affixed to a first substrate in order to transfer the useful layer thereto.

FIGS. 1 and 2 show a first support 10 that may be formed from a semiconductor material, for example silicon carbide SiC, mono- or polycrystalline silicon, etc, or may be formed from an insulating material, for example sapphire. A layer 12 is formed or deposited on the first support and forms a releasable bonding interface. The layer 12 may be a layer of semiconducting or semiconductive oxide such as SiO2, semiconductor nitride, or the like. The layer 12 forms a releasable bonding interface between the first support 10 and a useful layer. In this case, the useful layer includes a base layer 14 on which a layer 16 has been formed or deposited. Typically, the base layer 14 is a seed layer on which the layer 16 is formed by epitaxy. The seed layer may be formed of silicon carbide, sapphire, gallium nitride, silicon, or aluminum nitride, for example. In one embodiment, the base layer 14 is formed of SiC while the epitaxially grown layer is formed of a metal nitride such as gallium nitride GaN, or formed by a stack of different metal nitrides. Such a useful layer structure can advantageously be used to fabricate light-emitting diodes (LEDs).

In a variation, the releasable bonding interface 12 between the first support 10 and the useful layer may not be a layer as such. Instead, the useful layer may be weakly bonded to the support 10 at the interface therebetween.

As shown in FIG. 1, the first support 10 is slightly larger than the assembly of layers 12, 14 and 16 formed on the support. The layer 16 may be grown by epitaxy carried out in a "full wafer" reactor. Thus, the growth extends not only above the seed layer 14, but also around a peripheral ring 161 which covers the ledge or periphery of the support 10.

FIG. 2 illustrates affixing the assembly shown in FIG. 1, termed the first substrate, to a second support 20. In this case, a metal bonding technique is used and the bonding layer is illustrated at 22. The useful layer 14, 16 is transferred from the first support 10 to the second support 20 after fixing or bonding as described above. A detachment tool may be used to apply a stress or force to the interface layer 12 between the useful layer 14, 16 and the first support 10, to detach the useful layer by urging detachment in the plane of the interface.

However, FIG. 2 shows that the deposited GaN peripheral ring 161 causes two problems. First, it reinforces the bond between the useful layer 14, 16 and the first support at the periphery of the first substrate. Second, it hinders direct access to the bonding interface 12 by a detachment tool (such as a thin blade, a jet of fluid, etc.), and makes it impossible to directly apply the required detachment force or stress thereto (see arrow F1 in FIG. 3*a*).

Several solutions for solving these problems are described below.

Figure 3A:
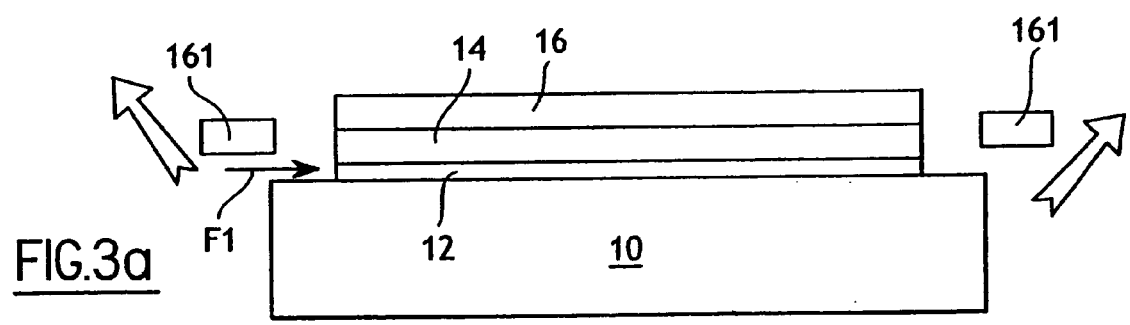
FIGS. 3*a* and 3*b* are cross sectional views illustrating removal of residual material according to this invention.

A first solution to this problem is shown in FIG. 3*a*. In this implementation, the peripheral ring 161 is removed. In a first embodiment, removal can be achieved by etching. Thus, a mask may be used on the free face of the useful layer 14, 16, to permit access only to the ring 161. An attack medium suitable for removing the ring material is then used to attack and remove the ring over its entire thickness, and thus to permit access to the detachable interface layer 12. In the present example, because the ring is made of GaN, the following is preferably used: plasma etching or RIE (reactive ion etching) based on $SiCl_4$, $BCl_3$ (for further information, reference can be made to the article "GaN: Processing, Defects and Devices", S. J. Pearton et al, Journal of Applied Physics, vol. 86, no 1, $1^{st}$ Jul. 1999). Other etching techniques such as plasma etching can be used.

In a second embodiment, the ring is removed using a splitting or trimming technique. A mechanical saw, a laser or an ion beam could be used to split off or trim the peripheral ring 161 from the support 10. The ring may be removed by using a cylindrical cut and a cut in a transitional plane between the ring 161 and the first support 10. In all cases, care is taken that an attack or a splitting method provides satisfactory access to the detachable interface layer 12 to allow transfer of the useful layer. It should be noted that merely partially removing the ring 161 may be sufficient to attenuate the peripheral bond between the first support 10 and the useful layer 14, 16, and may be enough to allow proper use of a detachment tool. Alternately, it is possible to remove the ring 161 while also penetrating into the support itself.

Figure 3B:
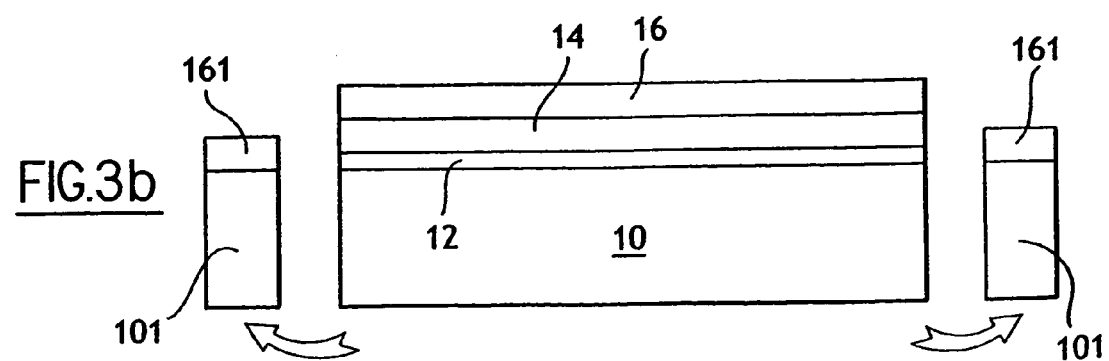

FIG. 3*b* illustrates another variation wherein splitting is carried out through the entire thickness of the first substrate so that not only the interfering ring 161 is removed, but also removed is an adjacent portion 101 of the first support 10. This method may be suitable when it is difficult to control the working depth of the splitting technique. It is preferable to remove the ring 161 before the second support 20 is affixed to the useful layer 14, 16. However, in some cases it may be possible to remove the peripheral ring after the second support 20 has been bonded to the substrate.

Figure 4:
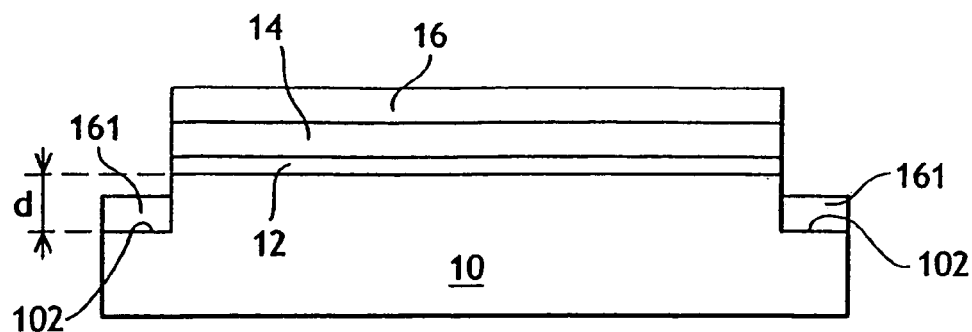
FIG. 4 is a cross sectional view of the first substrate illustrating a particular arrangement of a first support according to the invention.

FIG. 4 illustrates yet another approach for overcoming the problem caused by the peripheral deposit 161. In this case, a first support 10 is specifically prepared to include a peripheral recess 102. The peripheral recess advantageously extends in a radial direction (horizontally in FIG. 4) between the outer edge of the support 10 and the outer edges of the interface layer 12 and useful layer 14, 16. In the axial direction (vertically in FIG. 4), the recess 102 preferably extends to a depth (d) that is at least equal to the thickness of the residual material 161 deposited on the first support 10, so that at the end of the deposition operation, the peripheral ring 161 does not obstruct and/or does not bond to the detachable interface. Thus, in this case, the ring 161 does not have to be removed. The recess is preferably produced before forming the layers 12 and 14, and in any case before forming all or a portion of the useful layer which may cover the periphery of the first substrate. Preferably, the recess is formed by removing a portion of the first support with a laser beam or by mechanical trimming.

Figure 5:
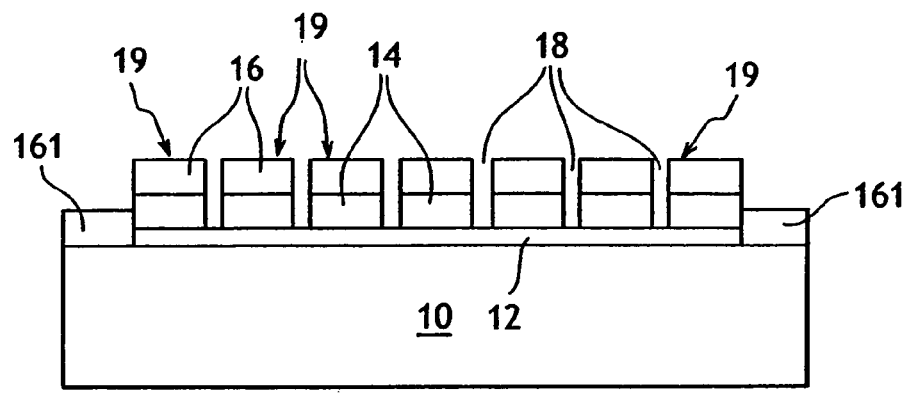
FIGS. 5 and 6 are cross sectional and enlarged plan views respectively, of a particular arrangement of the useful layer for gaining access to the interface between it and the first support according to the invention.
Figure 6:
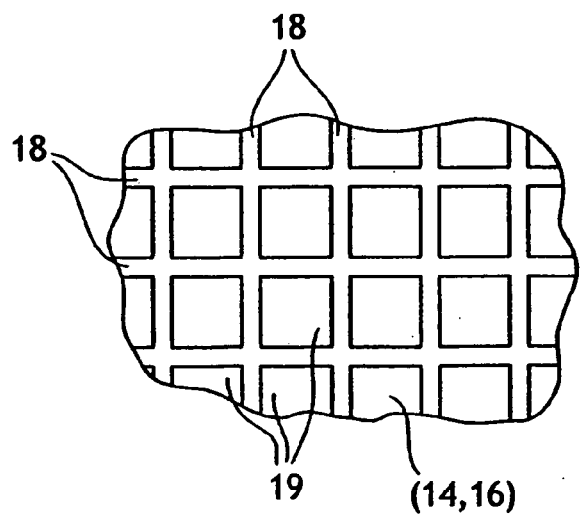

A further approach is shown in FIGS. 5 and 6. In this variation, cuts or channels 18 are formed in the thickness of the useful layer 14, 16, to a depth equal to that of the interface layer 12. These cuts define individual islets or tiles 19. The islets may be square in shape, as shown in FIG. 6, with a size that is preferably in the range of from 1×1 square micrometer ($\mu m^2$) to 300×300 $\mu m^2$. The cuts can be formed either mechanically, for example by using a saw splitting technique, or by using a laser splitting or ion beam splitting technique. The cuts can also be chemically etched by first placing an etching mask on the free surface of the useful layer 14,16 that allows for a selective geometric attack. Preferably, and in particular to prevent the attack from excavating the walls of the channels too much, a dry or wet etching technique is used. When the useful layer is formed from a seed layer of SiC 14 on which GaN epitaxy is used, argon based ion etching may be used (for further information, see the article "GaN: Processing, Defects and Devices", cited above).

Such an approach avoids reinforcement of the interface between the useful layer and the first support caused by the presence of the peripheral ring 161. In particular, after producing the assembly shown in FIG. 1 channels are formed so that each individualized tile, which is not itself subjected to the reinforcement due to the ring 161, can be detached by force from the support. It should be noted that the force can be a tension, bending or shear stress, or a variety of combinations of such forces.

Clearly, the present invention can be applied to a very wide variety of semiconductor materials. In addition to the example of a layer of nitride developed on silicon carbide on insulator (SiCOI) as described above, the invention can be employed, for example, when transferring a useful silicon layer in which certain methods for fabricating components using CMOS technology on a second insulating support 10 have been carried out. Many other applications are also possible. The skilled person will be able to readily select solutions that are suitable (i.e. choose one of the three approaches described, choose the method of material removal, etc.) as a function of the materials used. In addition, the three approaches of the invention described above can be combined together.

What is claimed is:

1. A method for forming an assembly for transfer of a useful layer comprising:
   forming a useful layer on a first support having an interface therebetween, and forming a residual material on a portion of the first support to form the assembly; and
   processing the first support to attenuate bonding between the useful layer and the first support caused by the residual material;
   wherein processing of the first support comprises forming a peripheral recess on the first support so that the residual material does not contact the useful layer.

2. The method of claim 1 wherein the useful layer is weakly bonded to the support to facilitate detachment.

3. The method of claim 1 wherein the interface is a detachable interface layer provided on the first support before forming the useful layer.

4. The method of claim 1 which further comprises:
   affixing a free face of the useful layer to a second support; and
   detaching the useful layer at the interface to transfer the useful layer to the second support.

5. The method of claim 4 which further comprises detaching the useful layer by using at least one of tension forces, bending forces and shear stress forces.

6. The method of claim 4 which further comprises directing at least one of a thin blade or a jet of fluid to the interface layer to detach the useful layer.

7. The method of claim 1 wherein processing the first support comprises removing residual material.

8. The method of claim 7 which further comprises removing at least a portion of the first support that is in contact with the removed residual material.

9. The method of claim 7 wherein removing residual material comprises removing at least a portion of a peripheral zone of residual material covering an edge of the interface.

10. The method of claim 9 wherein the peripheral zone is removed by at least one of splitting or etching.

11. The method of claim 10 wherein the peripheral zone is removed by etching and which further comprises masking the useful layer prior to etching.

12. The method of claim 1 wherein the recess is at least one cut or separating channel between a free surface of the useful layer and the interface to separate the useful layer from the residual material.

13. The method of claim 12 wherein the separating channel is cut by using at least one of a saw splitting technique, a laser splitting technique, and an ion beam splitting and masked chemical etching technique.

14. The method of claim 12 wherein which further comprises forming a plurality of cuts or separating channels in the useful layer to form a plurality of useful layer islets.

15. The method of claim 14 which further comprises:
    affixing free faces of the islets to a second support; and
    detaching a majority of the islets at the interface.

16. The method of claim 15 which further comprises detaching the islets by using at least one of tension forces, bending forces and shear stress forces.

17. The method of claim 15 wherein the islets are rectangular.

18. The process of claim 1, wherein the width and depth of the peripheral recess is sufficient to accommodate the volume of residual material resulting from formation of the useful layer.

19. The method of claim 1 which further comprises using full wafer epitaxy to deposit at least a portion of the useful layer.

20. The method of claim 19 wherein the useful layer comprises a seed layer for epitaxial growth and at least one epitaxial layer.

21. The method of claim 20 wherein the seed layer is made of at least one of silicon carbide, sapphire, gallium nitride, silicon and aluminum nitride.

22. The method of claim 20 wherein the epitaxial layer is formed from one or more metal nitrides.

23. The method of claim 1 wherein the first support is made from at least one of a semiconductor, a semiconducting or semiconductive carbide, and an insulator material.

24. The method of claim 1 which further comprises providing the interface by at least one of implanting gas species, forming a porous layer that can be attacked chemically, and bonding a detachable layer to the first support before forming the useful layer by using a controlled molecular bonding process.

25. The method of claim 1 wherein the useful layer comprises a seed layer for epitaxial layer that forms the residual material.

26. The method of claim 25 wherein the seed layer is made of at least one of silicon carbide, sapphire, gallium nitride, silicon and aluminum nitride.

27. The method of claim 25 wherein the epitaxial layer is formed from one or more metal nitrides.

28. A method for forming an assembly for transfer of a useful layer comprising:
   forming a peripheral recess on a support; and
   forming a useful layer on the support while also forming a residual material on a portion of the support to form the assembly;
   wherein the peripheral recess has a width and depth sufficient to accommodate the volume of residual material resulting from formation of the useful layer so that the residual material does not contact the useful layer.

* * * * *

UNITED STATES PATENT AND TRADEMARK OFFICE
CERTIFICATE OF CORRECTION

PATENT NO. : 7,122,095 B2  Page 1 of 1
APPLICATION NO. : 10/800252
DATED : October 17, 2006
INVENTOR(S) : Letertre et al.

It is certified that error appears in the above-identified patent and that said Letters Patent is hereby corrected as shown below:

Title Page:
Item (56) References Cited, OTHER PUBLICATIONS, S. Kodama et al. reference, change "Gated Gabricated" to -- Gates Fabricated --; and delete "vol. 241ga, p. 434-435 (19099)" and insert -- Extended Abstracts of the 1999 International Conference on Solid State Devices and Materials, Tokyo, Japan (1999), pp. 434-435. --.

Column 6:
Line 37, after "The method of claim 12" delete "wherein".

Column 7:
Line 6, after "comprises a seed layer for epitaxial" insert -- growth and at least one epitaxial --.

Signed and Sealed this

Twenty-seventh Day of January, 2009

JOHN DOLL
*Acting Director of the United States Patent and Trademark Office*